United States Patent
Sung et al.

(10) Patent No.: US 10,067,176 B2
(45) Date of Patent: Sep. 4, 2018

(54) INSULATION RESISTANCE MEASURING DEVICE AND METHOD CAPABLE OF RAPIDLY MEASURING INSULATION RESISTANCE

(71) Applicant: LG CHEM, LTD., Seoul (KR)

(72) Inventors: Chang-Hyun Sung, Daejeon (KR);
Young-Hwan Kim, Daejeon (KR);
Jae-Dong Park, Daejeon (KR);
Ho-Byung Yoon, Daejeon (KR);
Sang-Hoon Lee, Daejeon (KR);
Tae-Joong Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 63 days.

(21) Appl. No.: 15/124,887

(22) PCT Filed: Oct. 2, 2015

(86) PCT No.: PCT/KR2015/010455
§ 371 (c)(1),
(2) Date: Sep. 9, 2016

(87) PCT Pub. No.: WO2016/053055
PCT Pub. Date: Apr. 7, 2016

(65) Prior Publication Data
US 2017/0016951 A1 Jan. 19, 2017

(30) Foreign Application Priority Data
Oct. 2, 2014 (KR) .................. 10-2014-0133391

(51) Int. Cl.
*G01R 31/12* (2006.01)
*G01R 31/36* (2006.01)
(Continued)

(52) U.S. Cl.
CPC ......... *G01R 31/1236* (2013.01); *G01R 1/203* (2013.01); *G01R 1/206* (2013.01);
(Continued)

(58) Field of Classification Search
None
See application file for complete search history.

(56) References Cited

U.S. PATENT DOCUMENTS

2008/0054907 A1* 3/2008 Kudo .................. G01R 31/025
324/426
2009/0289640 A1* 11/2009 Kawamura .......... G01R 27/025
324/658
(Continued)

FOREIGN PATENT DOCUMENTS

JP    2004-325382 A    11/2004
JP    2013-140162 A    7/2013
(Continued)

OTHER PUBLICATIONS

Kim Suk Hyung et al.; Fault detecting method of vehicle; Feb. 11, 2014; Kia Motors Corp; Hyundai Motor Co Ltd.; KR 101361285 B1.*

(Continued)

*Primary Examiner* — Melissa Koval
*Assistant Examiner* — Nasima Monsur
(74) *Attorney, Agent, or Firm* — Birch, Stewart, Kolasch & Birch, LLP

(57) ABSTRACT

An insulation resistance measuring device including a positive electrode test resistor connected to a positive electrode node of a battery assembly, a negative electrode test resistor connected to a negative electrode node of the battery assembly, a first switch connecting the positive electrode node of the battery assembly to the positive electrode test resistor, a second switch connecting the negative electrode node of the
(Continued)

battery assembly to the negative electrode test resistor, a voltage measurement unit that measures a first voltage applied to the positive electrode test resistor and a second voltage applied to the negative electrode test resistor, and a voltage estimation unit that estimates a final convergence value of the first and second voltages.

15 Claims, 7 Drawing Sheets

(51) Int. Cl.
    *G01R 1/20* (2006.01)
    *G01R 19/165* (2006.01)
    *G01R 27/02* (2006.01)
    *H01M 10/48* (2006.01)

(52) U.S. Cl.
    CPC ..... *G01R 19/16542* (2013.01); *G01R 27/025* (2013.01); *G01R 31/12* (2013.01); *G01R 31/36* (2013.01); *G01R 31/3655* (2013.01); *G01R 31/3662* (2013.01); *G01R 31/3696* (2013.01); *H01M 10/48* (2013.01)

(56) References Cited

U.S. PATENT DOCUMENTS

| | | | |
|---|---|---|---|
| 2010/0156426 A1* | 6/2010 | Kang | G01R 31/025 324/444 |
| 2013/0176041 A1* | 7/2013 | Yang | G01R 27/025 324/691 |
| 2013/0176042 A1 | 7/2013 | Huh | |
| 2014/0084933 A1 | 3/2014 | Jang et al. | |
| 2014/0095093 A1 | 4/2014 | Hong et al. | |
| 2014/0159908 A1 | 6/2014 | Hong et al. | |

FOREIGN PATENT DOCUMENTS

| | | |
|---|---|---|
| KR | 10-2013-0112802 A | 10/2013 |
| KR | 10-2013-0128597 A | 11/2013 |
| KR | 10-1361285 B1 | 2/2014 |
| KR | 10-2014-0055186 A | 5/2014 |

OTHER PUBLICATIONS

International Search Report, issued in PCT/KR2015/010455, dated Feb. 23, 2016.

* cited by examiner

INSULATION RESISTANCE MEASURING DEVICE AND METHOD CAPABLE OF RAPIDLY MEASURING INSULATION RESISTANCE

TECHNICAL FIELD

The present disclosure relates to a technology for measuring insulation resistance, and more particularly, to an insulation resistance measuring device and method capable of rapidly and accurately measuring insulation resistance.

The present application claims the benefit of Korean Patent Application No. 10-2014-0133391 filed on Oct. 2, 2014 with the Korean Intellectual Property Office, the disclosure of which is incorporated herein by reference in its entirety.

BACKGROUND ART

Along with the recently increased demand for portable electronic products such as laptop computers, video cameras, mobile phones, and so on, the development of electric vehicles, energy storage batteries, robots, satellites, and so on started in earnest and led into active researches on high-performance secondary batteries capable of repeated charging and discharging.

Currently, commercially available secondary batteries comprise nickel cadmium, nickel hydrogen, nickel zinc and lithium secondary batteries. Among them, lithium secondary batteries have drawn much attention because of little memory effect to allow unrestrained charging and discharging, as well as very low self-discharging rate and high energy density, compared to nickel-based secondary batteries.

Meanwhile, these secondary batteries are used as single secondary batteries, but in order to provide high-voltage and/or high-capacity power storage, the secondary batteries are also frequently used in a form in which a plurality of secondary batteries are connected in series and/or in parallel, i.e., in a form of a battery pack including a battery management apparatus for controlling the overall charging and discharging operations of the secondary batteries therein.

For such power storage apparatus that uses high-voltage, high-capacity secondary battery, it is very important to remain insulated. If the insulation of the battery pack is not maintained, leakage current will be generated, causing numerous problems. Specifically, the leakage current can shorten service life of the battery pack, cause malfunction of the electrical equipment in which the battery pack is used, and cause safety accident such as electric shock.

In order to prevent the generation of the leakage current, a battery pack is provided with an insulation resistance measuring device that can monitor the insulation resistance. Such insulation resistance measuring device frequently or periodically measures the insulation resistance of the battery pack, thus allowing a battery pack management apparatus to monitor the insulation state.

FIG. 1 schematically illustrates a configuration of a battery pack provided with a related insulation resistance measuring device.

Referring to FIG. 1, the battery pack includes a battery assembly 20 which is an assembly of one or more battery cells 21. Additionally, the insulation resistances $R_{Leak(+)}$, $R_{Leak(-)}$ are provided on a positive electrode terminal of the battery assembly 20 and on a negative electrode terminal of the battery assembly 20, respectively. The insulation resistances $R_{Leak(+)}$, $R_{Leak(-)}$ can be equivalent resistances that represent the insulation state of the battery pack. When the insulation state of the battery pack is well maintained, the resistance value of the insulation resistance will have a sufficiently high value, whereas the resistance value of the insulation resistance will have a low value below a threshold when the insulation state of the battery pack is broken.

Referring to FIG. 1 again, an insulation resistance measuring device 10 is connected to the positive electrode terminal and the negative electrode terminal of the battery assembly 20. The insulation resistance measuring device 10 includes a test resistor 11 therein, and a voltage measurement unit 12 for measuring a voltage applied to the test resistor 11. The insulation resistance measuring device 10 calculates insulation resistance $R_{Leak(+)}$ of the positive electrode side and insulation resistance $R_{Leak(-)}$ of the negative electrode side by using voltage value measured through the voltage measurement unit 12.

The problem is that the battery pack may have a presence of parasitic capacitor. In an equivalent circuit of a parasitic capacitor component modeled in the same manner as the insulation resistance, the parasitic capacitor component can be expressed as a capacitor connected in parallel to the insulation resistance.

FIG. 2 schematically illustrates an equivalent circuit of a battery pack representing an insulation resistance and a parasitic capacitor component. That is, the battery pack illustrated in FIG. 2 includes insulation resistances $R_{Leak(+)}$, $R_{Leak(-)}$, and parasitic capacitors $C_{P(+)}$, $C_{P(-)}$ connected in parallel to the insulation resistances. As such, when parasitic capacitors $C_{P(+)}$, $C_{P(-)}$ are present, it is difficult for the insulation resistance measuring device 10 to measure voltage properly. That is, due to delay occurred after switching by the parasitic capacitors $C_{P(+)}$, $C_{P(-)}$, a predetermined time has to elapse until the voltage measurement unit 12 measures voltage correctly.

In other words, in an ideal situation where no parasitic capacitors $C_{P(+)}$, $C_{P(-)}$ are present, the voltage value has a constant value immediately after switching. However, in a situation where there are parasitic capacitors $C_{P(+)}$, $C_{P(-)}$, the voltage reaches a stable state after a certain period of time.

Accordingly, in order to measure correct voltage value according to the related technology, it is necessary that a sufficient time passes to allow the voltage after switching to reach a stable state. In other words, the insulation resistance measuring device 10 needs an additional delay time to calculate insulation resistances $R_{Leak(+)}$, $R_{Leak(-)}$.

To summarize, according to related art, the presence of the parasitic capacitor components $C_{P(+)}$, $C_{P(-)}$ in the battery pack inhibits immediate calculation of the insulation resistances $R_{Leak(+)}$, $R_{Leak(-)}$.

DISCLOSURE

Technical Problem

The present disclosure is designed to solve the problems of the related art, and therefore the present disclosure is directed to providing insulation resistance measuring device and method that are capable of rapidly and accurately calculating the insulation resistance, despite parasitic capacitor components present in a battery pack.

The other objectives and advantages of the present disclosure can be understood with the following description and further elucidated with the embodiments of the present disclosure. Also, it should easily be understood that the other objectives and advantages of the present disclosure can be implemented by the means described in the claims and the combinations thereof.

Technical Solution

In one aspect of the present disclosure, there is provided an insulation resistance measuring device including a positive electrode test resistor connected to a positive electrode node of a battery assembly, a negative electrode test resistor connected to a negative electrode node of the battery assembly, a switch unit connecting the positive electrode test resistor and the negative electrode test resistor to the positive electrode node and the negative electrode node of the battery assembly respectively such that a certain circuit is formed, a switch control unit configured to control the switch unit, a voltage measurement unit configured to measure a first voltage applied to the positive electrode test resistor and a second voltage applied to the negative electrode test resistor, and a voltage estimation unit configured such that, after the certain circuit is formed, the voltage estimation unit under controlling of the switch control unit reads at least one voltage among the first voltage and the second voltage measured at the voltage measurement unit for at least two cycles according to a predetermined cycle, and estimates a final convergence value of at least one voltage among the first voltage and the second voltage by using the read voltage.

The switch unit may include a first switch provided on a first line connecting the positive electrode node of the battery assembly to the positive electrode test resistor to be selectively turned on or off, and a second switch provided on a second line connecting the negative electrode node of the battery assembly to the negative electrode test resistor to be selectively turned on or off.

The certain circuit may be any one of a first circuit in which the first switch and the second switch are turned on, a second circuit in which the first switch is turned on and the second switch is turned off, a third circuit in which the first switch is turned off and the second switch is turned on, and a fourth circuit in which the first switch and the second switch are turned off.

After the second circuit is formed, the voltage estimation unit may read the first voltage measured at the voltage measurement unit for at least two cycles according to the predetermined cycle, calculate a first estimate value using the read voltage and estimate that the first estimate value is a final convergence value of the first voltage.

After the third circuit is formed, the voltage estimation unit may read the second voltage measured at the voltage measurement unit for at least two cycles according to the predetermined cycle, calculate a second estimate value using the read voltage and estimate that the second estimate value is a final convergence value of the second voltage.

The insulation resistance measuring device may additionally include an insulation resistance calculation unit configured to calculate an insulation resistance of a positive electrode side of the battery assembly and an insulation resistance of a negative electrode side of the battery assembly, using a second circuit equation that is a circuit equation about the second circuit, a third circuit equation that is a circuit equation about the third circuit, and the first estimate value and the second estimate value.

The insulation resistance calculation unit may calculate the insulation resistance of the positive electrode side of the battery assembly and the insulation resistance of the negative electrode side of the battery assembly by substituting the first estimate value into the second circuit equation, substituting the second estimate value into the third circuit equation, and then finding a solution of quadratic simultaneous equations composed of the second circuit equation and the third circuit equation.

The voltage estimation unit may read at least one voltage among the first voltage and the second voltage measured at the voltage measurement unit for at least three cycles according to a predetermined cycle, and estimate a final convergence value of at least one voltage among the first voltage and the second voltage by using the read voltage.

The voltage estimation unit may estimate the final convergence value with a first read voltage read in a first cycle, a second read voltage read in a second cycle, and a third read voltage read in a third cycle, using the equation below:

$$y_f = \frac{y_2^2 - y_1 * y_3}{2 * y_2 - y_1 - y_3}$$

where, yf=final convergence value, y1=first read voltage, y2=second read voltage, y3=third read voltage.

The insulation resistance measuring device may additionally include a positive electrode distribution resistor provided on the first line, and a negative electrode distribution resistor provided on the second line.

The insulation resistance measuring device may additionally include a DC power supply provided on the second line.

A magnitude of voltage outputted from the DC power supply may be set such that the second voltage measured by the voltage measurement unit is a positive value.

In another aspect of the present disclosure, there is also provided a battery pack including the insulation resistance measuring device described above.

In yet another aspect of the present disclosure, there is also provided an electric vehicle including the insulation resistance measuring device described above.

In yet another aspect of the present disclosure, there is also provided an insulation resistance measuring method including steps of preparing an insulation resistance measuring device comprising a positive electrode test resistor connected to a positive electrode node of a battery assembly, a negative electrode test resistor connected to a negative electrode node of the battery assembly, a switch unit connecting the positive electrode test resistor and the negative electrode test resistor to the positive electrode node and the negative electrode node of the battery assembly respectively such that a certain circuit is formed, and a voltage measurement unit configured to measure a first voltage applied to the positive electrode test resistor and a second voltage applied to the negative electrode test resistor, controlling the switch unit to form a certain circuit, after the certain circuit is formed, reading at least one voltage among the first voltage and the second voltage measured at the voltage measurement unit for at least two cycles according to a predetermined cycle, and estimating a final convergence value of the at least one voltage among the first voltage and the second voltage using the voltage read in the reading step.

The switch unit may include a first switch provided on a first line connecting the positive electrode node of the battery assembly to the positive electrode test resistor to be selectively turned on or off, and a second switch provided on a second line connecting the negative electrode node of the battery assembly to the negative electrode test resistor to be selectively turned on or off.

The certain circuit may be any one of a first circuit in which the first switch and the second switch are turned on, a second circuit in which the first switch is turned on and the second switch is turned off, a third circuit in which the first switch is turned off and the second switch is turned on, and a fourth circuit in which the first switch and the second switch are turned off.

The step of forming the certain circuit may include forming the second circuit. The reading step may include, after the second circuit is formed, reading the first voltage for at least two cycles according to the predetermined cycle. The estimating step may include calculating a first estimate value with the voltage read in the reading step, and estimating that the first estimate value is a final convergence value of the first voltage.

The step of forming the certain circuit may include forming the third circuit. The reading step may include, after the third circuit is formed, reading the second voltage for at least two cycles according to the predetermined cycle. The estimating step may include calculating a second estimate value with the voltage read in the reading step, and estimating that the second estimate value is a final convergence value of the second voltage. The steps of forming the third circuit, reading the second voltage, and estimating that the second estimate value is the final convergence value of the second voltage may be performed prior to, or subsequent to the steps of forming the second circuit, measuring the first voltage, and estimating that the first estimate value is the final convergence value of the first voltage.

The insulation resistance measuring method may additionally include calculating an insulation resistance of a positive electrode side of the battery assembly and an insulation resistance of a negative electrode side of the battery assembly, using a second circuit equation that is a circuit equation about the second circuit, a third circuit equation that is a circuit equation about the third circuit, and the first estimate value and the second estimate value.

The insulation resistance calculating step may include calculating the insulation resistance of the positive electrode side of the battery assembly and the insulation resistance of the negative electrode side of the battery assembly by substituting the first estimate value into the second circuit equation, substituting the second estimate value into the third circuit equation, and then finding a solution of simultaneous quadratic equations composed of the second circuit equation and the third circuit equation.

The reading step may include reading at least one voltage among the first voltage and the second voltage for at least three cycles according to a predetermined cycle, and the estimating step may include estimating a final convergence value of the at least one voltage among the first voltage and the second voltage using the read voltage.

The estimating step may include estimating the final convergence value with a first read voltage read in a first cycle, a second read voltage read in a second cycle, and a third read voltage read in a third cycle, using the equation below:

$$y_f = \frac{y_2^2 - y_1 * y_3}{2 * y_2 - y_1 - y_3}$$

where, yf=final convergence value, y1=first read voltage, y2=second read voltage, y3=third read voltage.

Advantageous Effects

The present disclosure gives the following effects. According to an aspect of the present disclosure, voltage can be read at constant time intervals, and final convergence value of the voltage can be predicted using the read voltage. That is, before stable state is achieved, the final convergence value as a voltage value of the stable state can be predicted and the insulation resistance can be rapidly measured using the same.

Additionally, a variety of other effects can be provided, which may be understood by the description provided herein and further elucidated from the examples of the present disclosure.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Further, in the description of the present disclosure, related known configurations or functions will not be described in detail as it may obscure the subject matter of the present disclosure.

Figure 1:
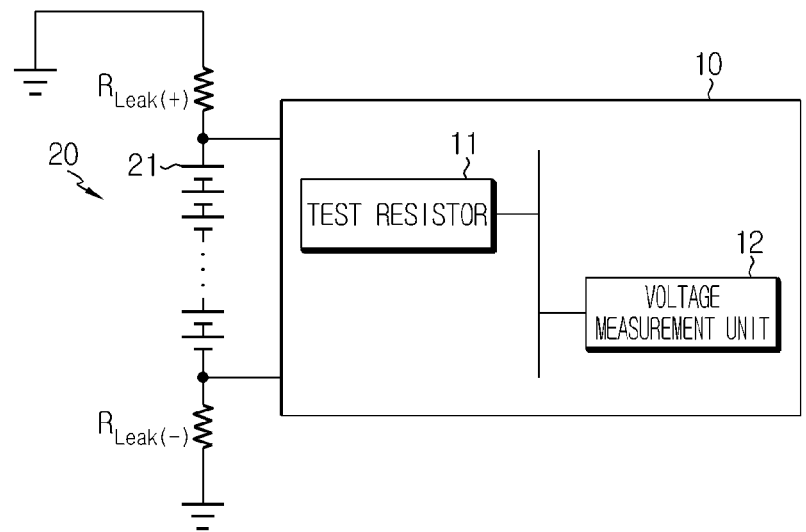
FIG. 1 schematically illustrates a configuration of a battery pack provided with a related insulation resistance measuring device.
Figure 2:
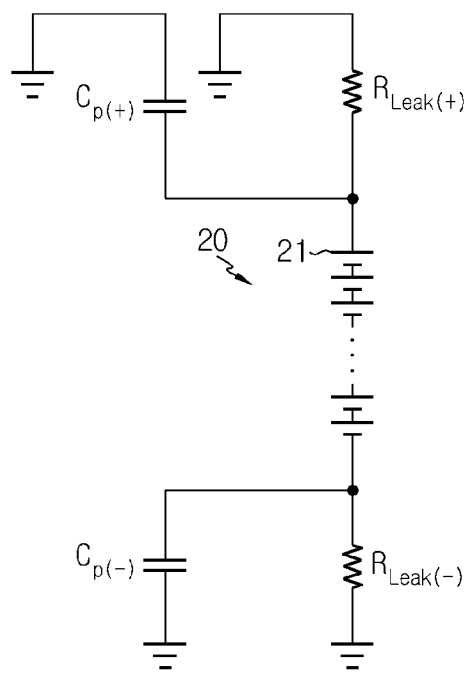
FIG. 2 schematically illustrates an equivalent circuit of a battery pack in which an insulation resistance and a parasitic capacitor component are represented.
Figure 3:
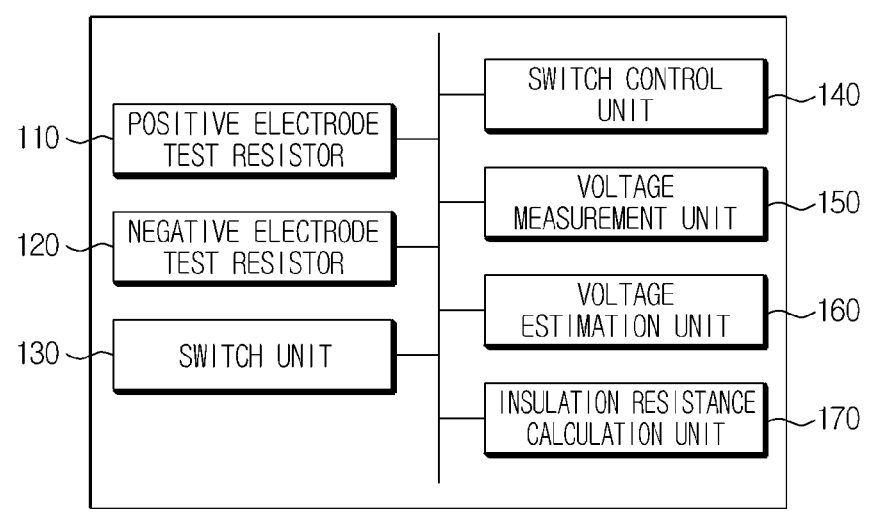
FIG. 3 schematically illustrates a functional configuration of an insulation resistance measuring device according to an exemplary embodiment of the present disclosure.
Figure 4:
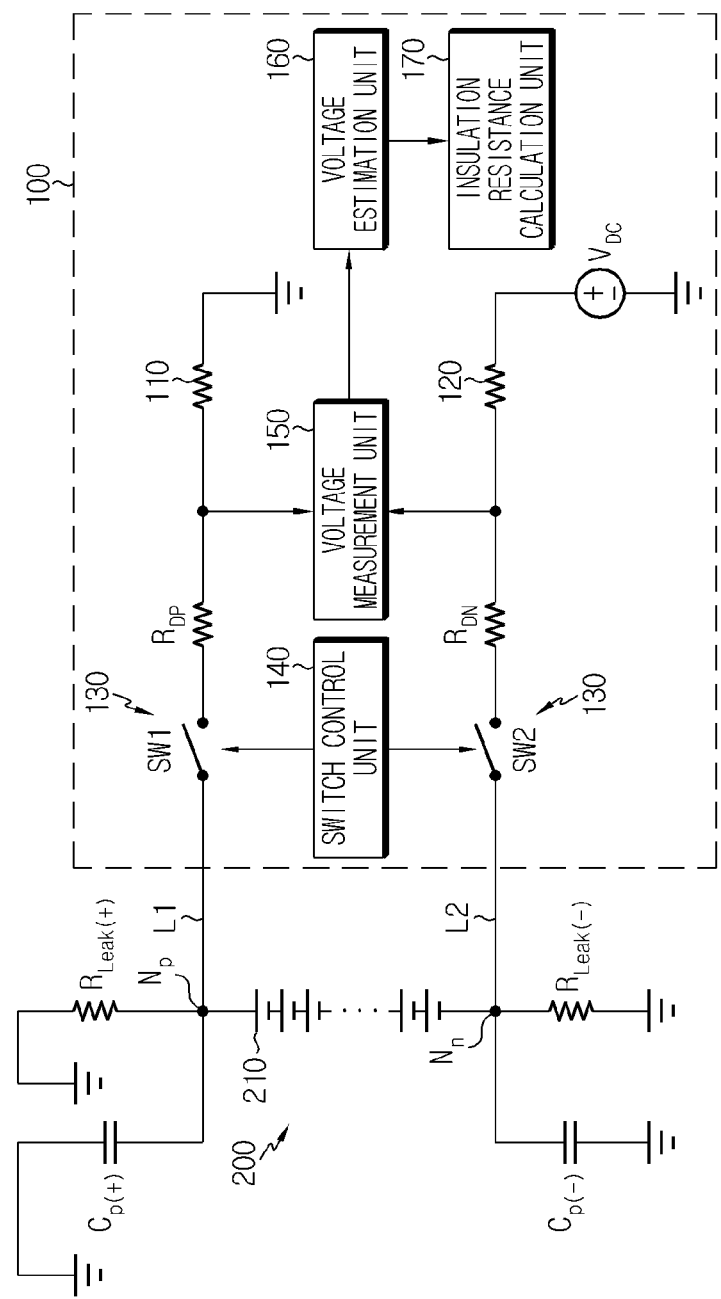
FIG. 4 schematically illustrates a circuit configuration of a battery pack provided with an insulation resistance measuring device according to an exemplary embodiment of the present disclosure.

FIG. 3 schematically illustrates a functional configuration of an insulation resistance measuring device according to an exemplary embodiment of the present disclosure, and FIG. 4 schematically illustrates a circuit configuration of a battery pack provided with an insulation resistance measuring device according to an exemplary embodiment of the present disclosure.

Referring to FIGS. 3 and 4, the insulation resistance measuring device 100 is connected to a positive electrode node $N_P$ and a negative electrode node $N_N$ of a battery assembly 200 provided in a battery pack.

In this case, the battery assembly 200 represents either a single battery cell 210 or an assembly of battery cells 210, and the assembly of the battery cells may be composed of battery cells 210 connected in series, in parallel, or in series and parallel.

The battery cell 210 may be a secondary battery such as an electrical double-layer capacitor or lithium ion battery including ultra capacitor, a lithium polymer battery, a nickel cadmium battery, a nickel hydrogen battery, a nickel zinc battery, and so on.

Meanwhile, insulation resistances $R_{Leak(+)}$, $R_{Leak(-)}$ are connected to the positive electrode node $N_P$ and the negative electrode node $N_N$ of the battery assembly 200. That is, the insulation resistance $R_{Leak(+)}$ of the positive electrode side is connected to the positive electrode node $N_P$ of the battery assembly 200 and the insulation resistance $R_{Leak(-)}$ of the negative electrode side is connected to the negative electrode node $N_N$ of the battery assembly 200. The insulation resistances $R_{Leak(+)}$, $R_{Leak(-)}$ can be equivalent resistances that represent the insulation state of the battery pack. When the insulation state of the battery pack is well maintained, the resistance value of the insulation resistance will have a sufficiently high value, whereas the resistance value of the insulation resistance will have a low value below a threshold when the insulation state is broken.

Further, parasitic capacitors $C_{P(+)}$, $C_{P(-)}$ are connected to the positive electrode node $N_P$ and the negative electrode node $N_N$ of the battery assembly 200. That is, the parasitic capacitor $C_{P(+)}$ of the positive electrode side is connected to the positive electrode node $N_P$ of the battery assembly 200, and the parasitic capacitor $C_{P(-)}$ of the negative electrode side is connected to the negative electrode node $N_N$ of the battery assembly 200. Like the insulation resistances $R_{Leak(+)}$, $R_{Leak(-)}$ described above, these parasitic capacitors $C_{P(+)}$, $C_{P(-)}$ can be regarded as the equivalent capacitors that represent the capacitor components. As illustrated in FIG. 4, the parasitic capacitors $C_{P(+)}$, $C_{P(-)}$ may be modeled into a form that is connected in parallel to the insulation resistances $R_{Leak(+)}$, $R_{Leak(-)}$ of the battery assembly 200.

Referring again to FIGS. 3 and 4, the insulation resistance measuring device 100 according to an exemplary embodiment may include a positive electrode test resistor 110, a negative electrode test resistor 120, a switch unit 130, a voltage measurement unit 150, a switch control unit 140, a voltage estimation unit 160, and an insulation resistance calculation unit 170.

The positive electrode test resistor 110 may be connected to the positive electrode node $N_P$ of the battery assembly 200. One end of the positive electrode test resistor 110 may be connected to the positive electrode node $N_P$ of the battery assembly 200, and the other end may be connected to a ground node. That is, as illustrated in FIG. 4, the positive electrode test resistor 110 may be provided between the positive electrode node $N_P$ of the battery assembly 200 and a ground (i.e., a ground node).

The negative electrode test resistor 120 may be connected to the negative electrode node $N_N$ of the battery assembly 200. One end of the negative electrode test resistor 120 may be connected to the negative electrode node $N_N$ of the battery assembly 200, and the other end may be connected to a ground node. That is, as illustrated in FIG. 4, the negative electrode test resistor 120 may be provided between the negative electrode node $N_N$ of the battery assembly 200 and a ground (i.e., a ground node).

The switch unit 130 may electrically connect or disconnect the battery assembly 200 to or from the test resistor. That is, the switch unit 130 may connect or disconnect the positive electrode test resistor 110 to or from the positive electrode node $N_P$ of the battery assembly 200, or connect or disconnect the negative electrode test resistor 120 to or from the negative electrode node $N_N$ of the battery assembly 200. Such switching operation of the switch unit 130 allows the positive electrode test resistor 110 and the positive electrode terminal of the battery assembly 200 to be connected or disconnected and the negative electrode test resistor 120 and the negative electrode terminal of the battery assembly 200 to be connected or disconnected such that a certain circuit can be formed.

According to an exemplary embodiment, the switch unit 130 may include a first switch SW1 and a second switch SW2, as illustrated in FIG. 4.

The first switch SW1 may connect or disconnect the positive electrode node $N_P$ of the battery assembly 200 to or from the positive electrode test resistor 110. The first switch SW1 may be provided on a first line L1 connecting the positive electrode node $N_P$ of the battery assembly 200 to the positive electrode test resistor 110 to be selectively turned on or off.

The second switch SW2 may connect or disconnect the negative electrode node $N_N$ of the battery assembly 200 to or from the negative electrode test resistor 120. The second switch SW2 may be provided on a second line L2 connecting the negative electrode node $N_N$ of the battery assembly 200 to the negative electrode test resistor 120 to be selectively turned on or off.

The switch control means 140 may control the first switch SW1 and the second switch SW2. That is, the switch control unit 140 may selectively turn on or off the first switch SW1 and the second switch SW2. The switch control unit 140 may control the first switch SW1 and the second switch SW2 to form a certain circuit.

More specifically, the switch control unit 140 may control the first switch SW1 and the second switch SW2 to form a variety of circuits including those exemplified below.

The switch control unit 140 may turn on the first switch SW1 and the second switch SW2 to form a first circuit. The first circuit represents a circuit in which the positive electrode test resistor 110 is connected to the positive electrode node $N_P$ and the negative electrode test resistor 120 is connected to the negative electrode node $N_N$.

Further, the switch control unit 140 may turn on the first switch SW1 and turn off the second switch SW2 to form a second circuit. The second circuit represents a circuit in which the positive electrode test resistor 110 is connected to the positive electrode node $N_P$ and the negative electrode test resistor 120 is not connected to the negative electrode node $N_N$.

Further, the switch control unit 140 may turn off the first switch SW1 and turn on the second switch SW2 to form a third circuit. The third circuit represents a circuit in which the positive electrode test resistor 110 is not connected to the positive electrode node $N_P$ and the negative electrode test resistor 120 is connected to the negative electrode node $N_N$.

Further, the switch control unit 140 may turn off the first switch SW1 and the second switch SW2 to form a fourth circuit. The fourth circuit represents a circuit in which the positive electrode test resistor 110 is not connected to the positive electrode node $N_P$ and the negative electrode test resistor 120 is not connected to the negative electrode node $N_N$.

As described above, the switch control unit 140 may control the first switch SW1 and the second switch SW2 to form a variety of circuits different from each other.

The voltage measurement unit 150 may measure the voltage applied to the positive electrode test resistor 110 and the voltage applied to the negative electrode test resistor 120. In this case, the voltage applied to the positive electrode test resistor 110 may be referred to as the 'first voltage', and the voltage applied to the negative electrode test resistor 120 may be referred to as the 'second voltage'. Further, the voltage measurement unit 150 may be composed of a positive electrode voltage measurement unit 150 and a negative electrode voltage measurement unit 150. That is, the voltage measurement unit 150 may be subdivided into a positive electrode voltage measurement unit to measure the voltage applied to the positive electrode test resistor 110, and a negative electrode voltage measurement unit to measure the voltage applied to the negative electrode test resistor 120.

After a certain circuit is formed according to controlling of the switch control unit 140, the voltage estimation unit 160 may estimate a final convergence value of at least one of the first voltage and the second voltage. That is, after a certain circuit is formed according to the controlling of the switch control unit 140, the voltage estimation unit 160 may estimate the voltage value of when the first voltage reaches the stable state, or may estimate the voltage value of when the second voltage reaches the stable state.

As described above in the description of the related art, because a battery pack has the parasitic capacitors $C_{P(+)}$, $C_{P(-)}$ present therein, a voltage value of a transient state may be measured if the voltage measurement unit 150 measures the first voltage or the second voltage immediately after the certain circuit is formed according to the controlling of the switch control unit 140. Accordingly, in order to have measurement of the first voltage and the second voltage in stable state, it is necessary that a sufficient time has to elapse.

The voltage estimation unit 160 may be configured to measure the insulation resistance rapidly, i.e., without waiting until the first voltage or the second voltage reaches the stable state, by estimating that a final convergence value that is a voltage value of when the first voltage or the second voltage reaches the stable state.

More specifically, the voltage estimation unit 160 may read at least one voltage among the first voltage and the second voltage measured at the voltage measurement unit 150 after the certain circuit is formed according to the controlling of the switch control unit 140, for at least two cycles according to a predetermined cycle, and estimate the final convergence value of at least one voltage among the first voltage and the second voltage using the read voltage.

In one example, the voltage estimation unit 160 may estimate the final convergence value for the first voltage after the second circuit is formed according to the controlling of the switch control unit 140. The voltage estimation unit 160 may estimate the final convergence value of the first voltage using the first voltage measured at the voltage measurement unit 150, after the second circuit is formed. That is, the voltage estimation unit 160 may use the first voltage measured at the voltage measurement unit 150, and may read the first voltage for two or more cycles according to predetermined cycle. The voltage estimation unit 160 may read for two or more cycles according to the predetermined cycle and estimate the final convergence value of the first voltage using the first voltage read for two or more cycles. In this case, the value estimated to be the final convergence value of the first voltage may be referred to as a 'first estimate value'.

In a similar manner, the voltage estimation unit 160 may estimate the final convergence value for the second voltage after the third circuit is formed according to the controlling of the switch control unit 140. After the third circuit is formed, the voltage estimation unit 160 may estimate the final convergence value of the second voltage using the second voltage measured at the voltage measurement unit 150. That is, the voltage estimation unit 160 may use the second voltage measured at the voltage measurement unit 150, and may read the second voltage for two or more cycles according to the predetermined cycle, and then estimate the final convergence value of the second voltage using the second voltage read for two or more cycles. In this case, the value estimated to be the final convergence value of the second voltage may be referred to as a 'second estimate value'.

When the final convergence value of the first voltage and the final convergence value of the second voltage are determined by the voltage estimation unit 160, the insulation resistance measuring device 100 may calculate the insulation resistance $R_{Leak(+)}$ of the positive electrode side of the battery assembly 200 and the insulation resistance $R_{Leak(-)}$ of the negative electrode side of the battery assembly 200, using the final convergence values of the first voltage and the second voltage.

The insulation resistance calculation unit 170 may calculate the insulation resistance $R_{Leak(+)}$ of the positive electrode side of the battery assembly 200, and the insulation resistance $R_{Leak(-)}$ of the negative electrode side of the battery assembly 200, by using the final convergence value of the first voltage and the final convergence value of the second voltage. More specifically, the insulation resistance calculation unit 170 may calculate the insulation resistance $R_{Leak(+)}$ of the positive electrode side of the battery assembly 200 and the insulation resistance $R_{Leak(-)}$ of the negative electrode side of the battery assembly 200, by using the circuit equation about the circuit used as a basis for a calculation of the final convergence value and the final convergence value.

Meanwhile, in calculating the insulation resistance, fast calculation of the insulation resistance can be achieved by predicting the final convergence value of the voltage and utilizing the result. Hereinafter, process of calculating insulation resistance according to an exemplary embodiment will be described in detail.

According to an exemplary embodiment, calculating the insulation resistance may be performed by process described below.

Figure 5:
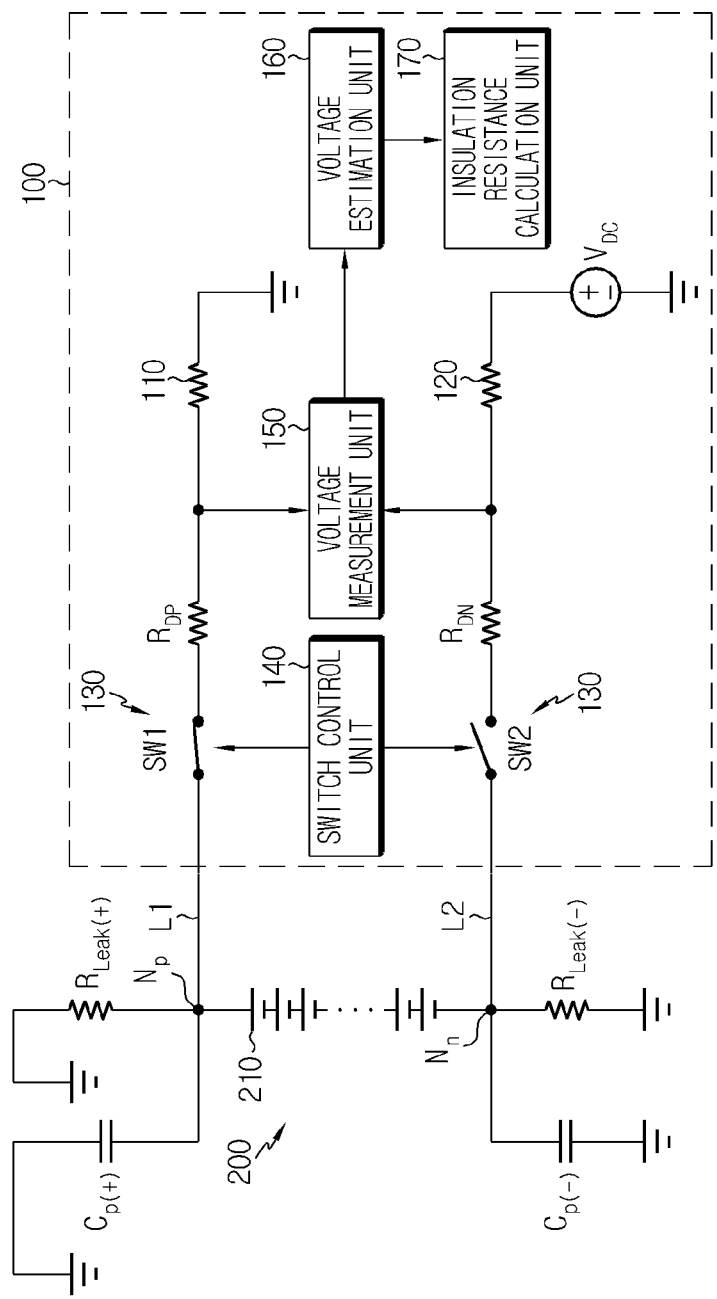
FIG. 5 illustrates a representation of a second circuit about the circuit configuration of FIG. 4.

First, the switch control unit 140 controls the switch to form a second circuit, as illustrated in FIG. 5. That is, the switch control unit 140 may control the switch unit 130 such that the positive electrode test resistor 110 and the positive electrode node $N_P$ of the battery assembly 200 are electrically connected, while the negative electrode test resistor 120 and the negative electrode node $N_N$ of the battery assembly 200 are not electrically connected. Next, after the second circuit is formed, the voltage measurement unit 150 measures the first voltage, i.e., the voltage applied to the positive electrode test resistor 110. Next, the voltage estimation unit 160 reads the first voltage measured at the voltage measurement unit 150 for two or more cycles according to the predetermined cycle. For example, after an arbitrary time t1 elapses from the time the second circuit is formed, the voltage estimation unit 160 reads the first voltage for three or more cycles according to a predetermined cycle D1. That is, the voltage estimation unit 160 reads a first read voltage that is the first voltage at time t1+D1, a second read voltage that is the first voltage at time t1+2*D1, and a third read voltage that is the first voltage at time t1+3*D1. Next, the voltage estimation unit 160 estimates the final convergence value of the first voltage by using the read first voltage. When the final convergence value of the first voltage is estimated by such process, the final convergence value of the second voltage is then estimated with a similar method.

Figure 6:
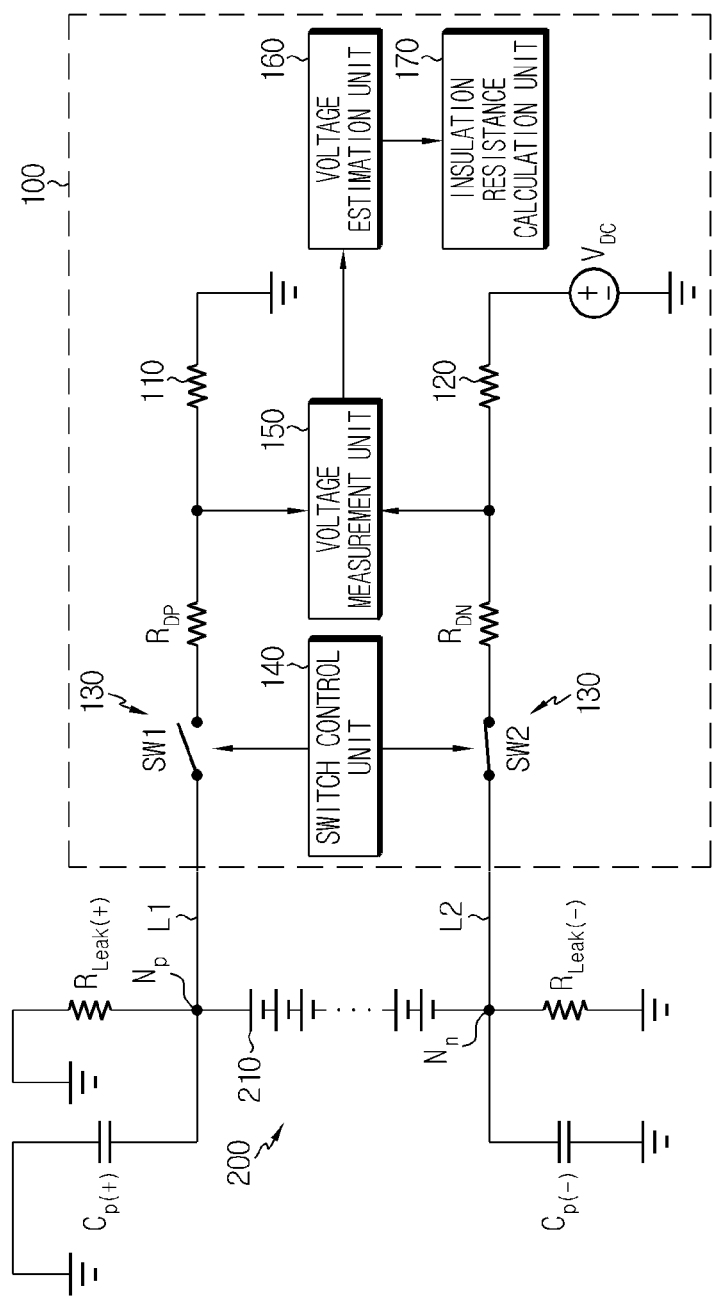
FIG. 6 illustrates a representation of a third circuit about the circuit configuration of FIG. 4.

The switch control unit 140 controls the switch to form a third circuit, as illustrated in FIG. 6. That is, the switch control unit 140 may control the switch unit 130 such that the negative electrode test resistor 120 and the negative electrode node $N_N$ of the battery assembly 200 are electrically connected, while the positive electrode test resistor 110 and the positive electrode node $N_P$ of the battery assembly 200 are not electrically connected. Next, after the forming of the third circuit, the voltage measurement unit 150 measures the second voltage, i.e., the voltage applied to the negative electrode test resistor 120. Next, the voltage estimation unit 160 reads the second voltage measured at the voltage measurement unit 150 for two or more cycles according to the predetermined cycle. Meanwhile, the cycle of reading the second voltage may be the same as the cycle of reading the first voltage, although these may be set differently as well. Similarly to when reading the first voltage, after an arbitrary time t2 elapses from the time when the third circuit is formed, the voltage estimation unit 160 reads the second voltage for three cycles according to a predetermined cycle D2. That is, the voltage estimation unit 160 reads a first read voltage that is the second voltage at time t2+D2, a second read voltage that is the second voltage at time t2+2*D2, and a third read voltage that is the second voltage at time t2+3*D2. Next, the voltage estimation unit 160 estimates the final convergence value of the second voltage by using the read second voltage.

When the final convergence value of the first voltage and the final convergence value of the second voltage are estimated as described above, by using the second circuit equation that is a circuit equation about the second circuit used as a basis for the determination of the final convergence value of the first voltage, and using the third circuit equation that is a circuit equation about the third circuit used as a basis for determination of the final convergence value of the second voltage, the insulation resistance $R_{Leak(+)}$ of the positive electrode side of the battery assembly 200 and the insulation resistance $R_{Leak(-)}$ of the negative electrode side of the battery assembly 200 are calculated. That is, the insulation resistance calculation unit 170 calculates the insulation resistance $R_{Leak(+)}$ of the positive electrode side of the battery assembly 200 and the insulation resistance $R_{Leak(-)}$ of the negative electrode side of the battery assembly 200, by using the second circuit equation, the third circuit equation, the first estimate value that is the final convergence value of the first voltage, and the second estimate value that is the final convergence value of the second voltage.

More specifically, the insulation resistance calculation unit 170 may derive two equations having insulation resistance $R_{Leak(+)}$ of the positive electrode side and the insulation resistance $R_{Leak(-)}$ of the negative electrode side as the unknowns, by substituting the first estimate value into the second circuit equation and substituting the second estimate value into the third circuit equation. That is, the insulation resistance calculation unit 170 may derive simultaneous quadratic equations composed of the second circuit equation substituted with the first estimate value and the third circuit equation substituted with the second estimate value. The insulation resistance calculation unit 170 may find the values of the two unknowns by solving such simultaneous quadratic equations. That is, the insulation resistance calculation unit 170 may calculate the unknowns, i.e., the insulation resistance $R_{Leak(+)}$ of the positive electrode side and the insulation resistance $R_{Leak(-)}$ of the negative electrode side, by solving the simultaneous quadratic equations.

Preferably, in estimating the final convergence value of the voltage, the voltage estimation unit 160 may read the voltage for three or more cycles and use the voltages of three or more cycles. That is, the voltage estimation unit 160 may read at least one voltage among the first voltage and the second voltage measured at the voltage measurement unit 150 for at least three cycles according to a predetermined cycle, and estimate the final convergence value of the at least one voltage among the first voltage and the second voltage by using the read voltage.

In one example, the voltage estimation unit 160 may read the voltage of three cycles and estimate the final convergence value with the equation below. That is, the voltage estimation unit 160 may estimate the final convergence value by substituting the first read voltage read in the first cycle, the second read voltage read in the second cycle, and the third read voltage read in the third cycle into the equation below:

$$y_f = \frac{y_2^2 - y_1 * y_3}{2 * y_2 - y_1 - y_3} \qquad \langle \text{Equation 1} \rangle$$

where, yf represents the final convergence value, y1 is the first read voltage, y2 is the second read voltage, and y3 is the third read voltage.

For example, in order to estimate the final convergence value of the first voltage, the voltage estimation unit 160 may read the voltage of three cycles for the first voltage. That is, the voltage estimation unit 160 may read the first read voltage, the second read voltage, and the third read voltage for the first voltage. The voltage estimation unit 160 may then estimate the final convergence value for the first voltage by substituting the read voltage value into the equation described above.

The final convergence value of the second voltage may be estimated with the same method described above, which will not be redundantly described in detail for the sake of brevity.

Meanwhile, the process of deriving the final convergence value of the voltage with Equation 1 will be described below.

The voltage as a subject of measurement is the voltage applied to the test resistor, and due to the capacitor component, the voltage applied to the test resistor can be expressed in the equation below. That is, the voltage applied to the test resistor can be expressed as a response to the primary RC circuit due to the resistance component and the capacitor component.

$$v(t) = y_f + (y_i - y_f) * e^{\frac{-t}{RC}} \quad \langle \text{Equation 2} \rangle$$

where, v(t) represents the voltage applied to the test resistor, yf is the final convergence value of v(t), yi is the initial value of v(t), R is an equivalent resistance of a certain circuit, and C is a capacitor or capacitance of a certain circuit.

By subtracting yf from both sides of Equation 2, Equation 2 can be expressed as equation below:

$$v(t) - y_f = (y_i - y_f) * e^{\frac{-t}{RC}} \quad \langle \text{Equation 3} \rangle$$

Let v(t) measured at t1, t2, t3 be y1, y2, y3, and by substituting t1, t2, t3 for t into Equation 3, following three equations are derived.

$$y_1 - y_f = (y_i - y_f) * e^{\frac{-t1}{RC}} \quad \langle \text{Equation 4} \rangle$$

$$y_2 - y_f = (y_i - y_f) * e^{\frac{-t2}{RC}} \quad \langle \text{Equation 5} \rangle$$

$$y_3 - y_f = (y_i - y_f) * e^{\frac{-t3}{RC}} \quad \langle \text{Equation 6} \rangle$$

By dividing Equation 4 by Equation 5 and dividing Equation 5 by Equation 6, the following equations are derived.

$$\frac{y_1 - y_f}{y_2 - y_f} = \frac{(y_i - y_f) * e^{\frac{-t1}{RC}}}{(y_i - y_f) * e^{\frac{-t2}{RC}}} = e^{\frac{t2-t1}{RC}} \quad \langle \text{Equation 7} \rangle$$

$$\frac{y_2 - y_f}{y_3 - y_f} = \frac{(y_i - y_f) * e^{\frac{-t2}{RC}}}{(y_i - y_f) * e^{\frac{-t3}{RC}}} = e^{\frac{t3-t2}{RC}} \quad \langle \text{Equation 8} \rangle$$

In Equations 7 and 8, when t1, t2 and t3 are measured at equal interval, the exponential function on the right side of Equation 7 and the exponential function on the right side of Equation 8 have the same value. Accordingly, Equations 7 and 8 have the following relationship.

$$\frac{y_1 - y_f}{y_2 - y_f} = \frac{y_2 - y_f}{y_3 - y_f} \quad \langle \text{Equation 9} \rangle$$

By rearranging Equation 9 with respect to yf, Equation 1 is derived. Accordingly, the final convergence value of the voltage can be obtained by substituting the first read voltage, the second read voltage, and the third read voltage into Equation 1.

Optionally, the voltage estimation unit 160 may repeatedly estimate the final convergence value. In this case, the voltage estimation unit 160 may repeatedly estimate the final convergence value for the same cycle, or alternatively, the voltage estimation unit 160 may repeatedly estimate the final convergence value for different cycles. Further, the final convergence value may be estimated by calculating an arithmetic mean value for the repeatedly-estimated final convergence values.

Further, optionally, the insulation resistance measuring device 100 according to an exemplary embodiment of the present disclosure may additionally include a voltage distribution resistor. Referring to FIG. 4 again, the insulation resistance measuring device 100 according to an exemplary embodiment includes a positive electrode distribution resistor $R_{DP}$ provided on the first line L1, and a negative electrode distribution resistor $R_{DN}$ provided on the second line L2. The positive electrode distribution resistor $R_{DP}$ and the negative electrode distribution resistor $R_{DN}$ are connected in series with the positive electrode test resistor 110 and the negative electrode test resistor 120, respectively. That is, the positive electrode distribution resistor $R_{DP}$ may be connected in series with the positive electrode test resistor 110 to adjust the voltage applied to the positive electrode test resistor 110 to a proper level. Likewise, the negative electrode distribution resistor $R_{DN}$ may be connected in series with the negative electrode test resistor 120 to adjust the voltage applied to the negative electrode test resistor 120 to a proper level.

Further, optionally, the insulation resistance measuring device 100 according to an exemplary embodiment of the present disclosure may additionally include a DC power supply $V_{DC}$ provided on the second line L2. That is, the insulation resistance measuring device 100 may additionally include a DC power supply $V_{DC}$ to apply a predetermined voltage to the negative electrode test resistor 120. The voltage value applied to the negative electrode test resistor 120 may not be a positive value, as the negative electrode test resistor 120 is connected to the negative electrode node $N_N$ of the battery assembly 200. Accordingly, the DC power supply $V_{DC}$ may be provided on the second line L2 such that the voltage value applied to the negative electrode test resistor 120 can be a positive value. Further, the magnitude of the voltage outputted from the DC power supply VDC may be set such that the second voltage applied to the negative electrode test resistor 120 is a positive value.

According to another aspect of the present disclosure, the insulation resistance measuring device 100 described above may be included in the battery pack. That is, the battery pack according to another aspect of the present disclosure may include the insulation resistance measuring device 100 described above.

Further, according to yet another aspect of the present disclosure, the insulation resistance measuring device 100 described above may be included in an electric vehicle. That is, the electric vehicle according to yet another aspect of the present disclosure may include the insulation resistance measuring device 100 described above. The 'electric vehicle' as used herein refers to a transportation means that uses electrical energy as a power source and it includes not only the electric vehicle, but also the hybrid vehicle.

Hereinafter, an insulation resistance measuring method according to yet another aspect of the present disclosure will be described. The insulation resistance measuring method according to yet another aspect of the present disclosure will not be redundantly described below, as the description for the insulation resistance measuring device described above may be equally applicable to the insulation resistance measuring method.

The insulation resistance measuring method according to an aspect of the present disclosure is a method of measuring insulation resistance using the insulation resistance measuring device described above, and the subjects of the respective operations of the insulation resistance measuring method may be the respective elements of the insulation resistance measuring device described above.

Figure 7:
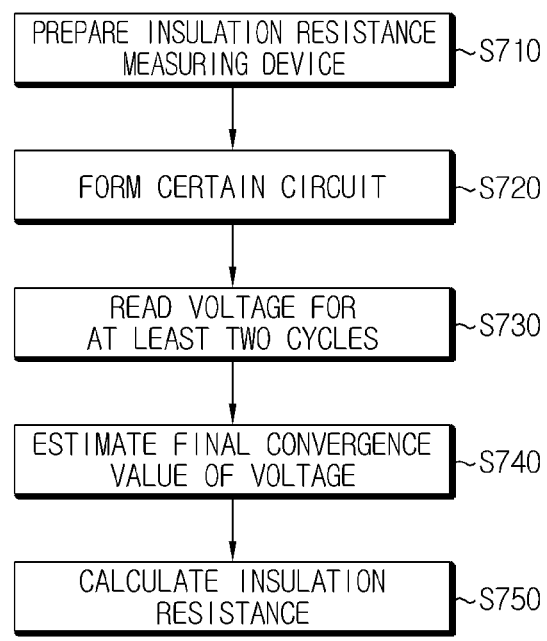
FIG. 7 is a flowchart representing an insulation resistance measuring method according to an exemplary embodiment of the present disclosure.

FIG. 7 is a flowchart representing an insulation resistance measuring method according to an exemplary embodiment of the present disclosure.

Referring to FIG. 7, the insulation resistance measuring method according to an exemplary embodiment of the present disclosure first performs a step of preparing an insulation resistance measuring device including a positive electrode test resistor 110, a negative electrode test resistor 120, a switch unit 130, and a voltage measurement unit 150, at S710. In this case, the positive electrode test resistor 110 may be connected to the positive electrode node $N_P$ of the battery assembly 200, and the negative electrode test resistor 120 may be connected to the negative electrode node $N_N$ of the battery assembly 200. Further, the switch unit 130 may connect the positive electrode test resistor 110 and the negative electrode test resistor 120 to the positive electrode node $N_P$ and the negative electrode node $N_N$ of the battery assembly 200 respectively such that a certain circuit can be formed. The voltage measurement unit 150 may measure the first voltage applied to the positive electrode test resistor 110, and the second voltage applied to the negative electrode test resistor 120.

The switch unit 130 may include a first switch SW1 and a second switch SW2. In this case, the first switch SW1 may be provided on the first line L1 connecting the positive electrode node $N_P$ of the battery assembly 200 to the positive electrode test resistor 110 to be selectively turned on or off. Further, the second switch SW2 may be provided on the second line L2 connecting the negative electrode node $N_N$ of the battery assembly 200 to the negative electrode test resistor 120 to be selectively turned on or off.

Next, the insulation resistance measuring method may perform a step of controlling the switch unit 130 to form a certain circuit, at S720. The 'certain circuit' as used herein may be any one of the first circuit, the second circuit, the third circuit, and the fourth circuit described above.

Next, after the certain circuit is formed, the insulation resistance measuring method may perform a step of reading at least one of the first voltage and the second voltage for at least two cycles according to a predetermined cycle, at S730.

Preferably, the reading step S730 may involve reading at least one voltage among the first voltage and the second voltage for at least three cycles according to a predetermined cycle. In one example, the reading step S730 may involve reading at least one voltage among the first voltage and the second voltage three times according to a predetermined cycle. In this case, the voltage read during the first cycle may be regarded as the first read voltage, the voltage read during the second cycle may be regarded as the second read voltage, and the voltage read during the third cycle may be regarded as the third read voltage.

Next, at S740, the insulation resistance measuring method may perform a step of estimating a final convergence value of at least one voltage among the first voltage and the second voltage using the voltages read in the reading step S730.

Preferably, the estimating step S740 may involve using the voltages read during three cycles of the reading step, and estimating the final convergence value with Equation 1 provided below.

$$y_f = \frac{y_2^2 - y_1 * y_3}{2 * y_2 - y_1 - y_3} \quad \langle \text{Equation 1} \rangle$$

where, yf represents the final convergence value, y1 is the first read voltage, y2 is the second read voltage, and y3 is the third read voltage.

Next, the insulation resistance measuring method may perform a step of calculating the insulation resistance of the battery assembly 200 using the final convergence value of the voltages, at S750.

Figure 8:
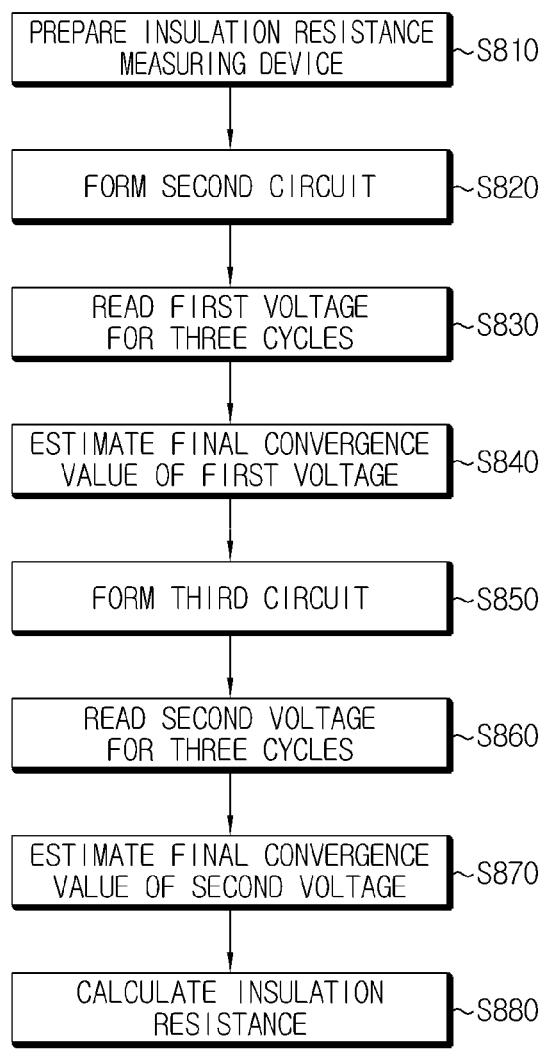
FIG. 8 is a flowchart representing an insulation resistance measuring method according to another exemplary embodiment of the present disclosure.

FIG. 8 is a flowchart representing an insulation resistance measuring method according to another exemplary embodiment of the present disclosure.

The insulation resistance measuring method according to another exemplary embodiment of the present disclosure illustrated in FIG. 8 is the method of measuring the insulation resistance by forming the second circuit and then estimating the final convergence value for the first voltage, and forming the third circuit and then estimating the final convergence value for the second voltage.

Referring to FIG. 8, the insulation resistance measuring method according to an exemplary embodiment of the present disclosure first performs a step of preparing an insulation resistance measuring device including a positive electrode test resistor 110, a negative electrode test resistor 120, a switch unit 130, and a voltage measurement unit 150, at S810.

Next, the insulation resistance measuring method performs a step of controlling the switch unit 130 to form the second circuit, at S820.

Next, after the second circuit is formed, the insulation resistance measuring method performs a step of reading the first voltage for three cycles according to a predetermined cycle, at S830.

Next, the insulation resistance measuring method performs a step of estimating a first estimate value that is the final convergence value for the first voltage, by substituting the first read voltage, the second read voltage, and the third read voltage for the first voltage into Equation 1 described above, at S840.

Next, the insulation resistance measuring method performs a step of controlling the switch unit 130 to form the third circuit, at S850.

Next, after the third circuit is formed, the insulation resistance measuring method performs a step of reading the second voltage for three cycles according to a predetermined cycle, at S860.

Next, the insulation resistance measuring method performs a step of estimating a second estimate value that is the final convergence value for the second voltage, by substituting the first read voltage, the second read voltage, and the third read voltage for the second voltage into Equation 1 described above, at S870.

Next, the insulation resistance measuring method performs a step of calculating the insulation resistance $R_{Leak(+)}$ of the positive electrode side and the insulation resistance $R_{Leak(-)}$ of the negative electrode side of the battery assembly 200 using the second circuit equation that is a circuit equation about the second circuit, the third circuit equation that is a circuit equation about the third circuit, and the first estimate value and the second estimate value, at S880.

Optionally, the insulation resistance calculating step S880 may involve calculating the insulation resistance $R_{Leak(+)}$ of the positive electrode side of the battery assembly 200 and the insulation resistance $R_{Leak(-)}$ of the negative electrode side of the battery assembly 200 by substituting the first estimate value into the second circuit equation, substituting the second estimate value into the third circuit equation, and then finding the value of the simultaneous quadratic equations composed of the second circuit equation and the third circuit equation.

Meanwhile, although the steps S820, 830, 840 to estimate the final convergence value for the first voltage are illustrated as these are performed prior to the steps S850, S860, S870 to estimate the final convergence value for the second voltage, the present disclosure is not limited to such order of the steps. That is, it is of course possible that the steps S850, 860, 870 to estimate the final convergence value for the second voltage may precede the steps S820, S830, S840 to estimate the final convergence value for the first voltage.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

The characteristics described in the individual exemplary embodiments of the present disclosure may be implemented in combination into one single embodiment. In contrast, a variety of characteristics described herein as a single exemplary embodiment may be individually implemented in a variety of exemplary embodiments, or implemented in a proper subcombination.

What is claimed is:

1. An insulation resistance measuring device, comprising:
a positive electrode test resistor connected to a positive electrode node of a battery assembly;
a negative electrode test resistor connected to a negative electrode node of the battery assembly;
a first switch provided on a first line connecting the positive electrode node of the battery assembly to the positive electrode test resistor, wherein the first switch is configured to selectively turned on or off;
a second switch provided on a second line connecting the negative electrode node of the battery assembly to the negative electrode test resistor, wherein the second switch is configured to selectively turned on or off;
a switch control unit configured to control the first switch and the second switch to form the following circuits:
a first circuit in which the first switch and the second switch are turned on;
a second circuit in which the first switch is turned on and the second switch is turned off; and
a third circuit in which the first switch is turned off and the second switch is turned on;
a voltage measurement unit configured to measure a first voltage applied to the positive electrode test resistor after the second circuit is formed and to measure a second voltage applied to the negative electrode test resistor after the third circuit is formed; and
a voltage estimation unit configured to:
read the first voltage measured at the voltage measurement unit for at least two cycles according to a predetermined cycle;
determine a final convergence value of the first voltage by using the read first voltage before a stable state of the first voltage is achieved;
read the second voltage measured at the voltage measurement unit for at least two cycles according the predetermined cycle; and
determine a final convergence value of the second voltage by using the read second voltage before a stable state of the second voltage is achieved.

2. The insulation resistance measuring device of claim 1, wherein the insulation resistance measuring device further comprises an insulation resistance calculation unit configured to calculate an insulation resistance of a positive electrode side of the battery assembly and an insulation resistance of a negative electrode side of the battery assembly, using a second circuit equation that is a circuit equation about the second circuit, a third circuit equation that is a circuit equation about the third circuit, and the final convergence value of the first voltage and the final convergence value of the second voltage.

3. The insulation resistance measuring device of claim 2, wherein the insulation resistance calculation unit calculates the insulation resistance of the positive electrode side of the battery assembly and the insulation resistance of the negative electrode side of the battery assembly by substituting the final convergence value of the first voltage into the second circuit equation, substituting the final convergence value of the second voltage into the third circuit equation, and then finding a solution of simultaneous quadratic equations composed of the second circuit equation and the third circuit equation.

4. The insulation resistance measuring device of claim 1, wherein the voltage estimation unit reads the first voltage measured at the voltage measurement unit for at least three cycles according to the predetermined cycle, and
wherein the voltage estimation unit reads the second voltage measured at the voltage measurement unit for at least three cycles according to the predetermined cycle.

5. The insulation resistance measuring device of claim 4, wherein
the voltage estimation unit determines the final convergence value with a first read voltage read in a first cycle, a second read voltage read in a second cycle, and a third read voltage read in a third cycle, using the equation below:

$$y_f = \frac{y_2^2 - y_1 * y_3}{2 * y_2 - y_1 - y_3}$$

where, yf=final convergence value, y1=first read voltage, y2=second read voltage, y3=third read voltage.

6. The insulation resistance measuring device of claim 1, wherein
the positive electrode distribution resistor is provided on the first line, and the negative electrode distribution resistor is provided on the second line.

7. The insulation resistance measuring device of claim 1, wherein the insulation resistance measuring device further comprises a DC power supply provided on the second line.

8. The insulation resistance measuring device of claim 7, wherein a magnitude of voltage outputted from the DC power supply is set such that the second voltage measured by the voltage measurement unit is a positive value.

9. A battery pack comprising the insulation resistance measuring device of claim 1.

10. An electric vehicle comprising the insulation resistance measuring device of claim 1.

11. An insulation resistance measuring method, comprising steps of:
preparing an insulation resistance measuring device comprising a positive electrode test resistor connected to a positive electrode node of a battery assembly, a negative electrode test resistor connected to a negative electrode node of the battery assembly, a first switch provided on a first line connecting the positive electrode node of the battery assembly to the positive electrode test resistor, wherein the first switch is configured to selectively turned on or off, a second switch provided on a second line connecting the negative electrode node of the battery assembly to the negative electrode test resistor, wherein the second switch is configured to selectively turned on or off, and a voltage measurement unit configured to measure a first voltage applied to the positive electrode test resistor and a second voltage applied to the negative electrode test resistor;

controlling the first switch and the second switch to form a first circuit in which the first switch is turned on and the second switch is turned on;

controlling the first switch and the second switch to form a second circuit in which the first switch is turned on and the second switch is turned off; and controlling the first switch and the second switch to form a third circuit in which the first switch is turned off and the second switch is turned on;

measuring a first voltage applied to the positive electrode test resistor after the second circuit is formed;

measuring a second voltage applied to the negative electrode test resistor after the third circuit is formed;

reading the first voltage for at least two cycles according to a predetermined cycle;

reading the second voltage for at least two cycles according to the predetermined cycle;

determining a final convergence value of the first voltage using the read first voltage before a stable state of the first voltage is achieved; and determining a final convergence value of the second voltage using the read second voltage before stable state of the second voltage is achieved.

12. The insulation resistance measuring method of claim 11, wherein the insulation resistance measuring method further comprises calculating an insulation resistance of a positive electrode side of the battery assembly and an insulation resistance of a negative electrode side of the battery assembly, using a second circuit equation that is a circuit equation about the second circuit, a third circuit equation that is a circuit equation about the third circuit, and the final convergence value of the first voltage and the final convergence value of the second voltage.

13. The insulation resistance measuring method of claim 12, wherein the insulation resistance calculating step comprises calculating the insulation resistance of the positive electrode side of the battery assembly and the insulation resistance of the negative electrode side of the battery assembly by substituting the final convergence value of the first voltage into the second circuit equation, substituting the final convergence value of the second voltage into the third circuit equation, and then finding a solution of simultaneous quadratic equations composed of the second circuit equation and the third circuit equation.

14. The insulation resistance measuring method of claim 11, wherein the first voltage is read for at least three cycles according to the predetermined cycle, and the second voltage is read for at least three cycles according to the predetermined cycle.

15. The insulation resistance measuring method of claim 14, wherein the final convergence value of the first voltage or the second voltage is determined with a first read voltage read in a first cycle, a second read voltage read in a second cycle, and a third read voltage read in a third cycle, using the equation below:

$$y_f = \frac{y_2^2 - y_1 * y_3}{2 * y_2 - y_1 - y_3}$$

where, yf=final convergence value, y1=first read voltage, y2=second read voltage, y3=third read voltage.

* * * * *